United States Patent [19]

Toyomoto et al.

[11] Patent Number: 4,844,719
[45] Date of Patent: Jul. 4, 1989

[54] PERMEABLE POLYMER MEMBRANE FOR DESICCATION OF GAS

[75] Inventors: Kazuo Toyomoto, Yokohama; Eigo Terada, Kamakura; Hiroshi Kobayashi, Yokohama; Yoshiaki Kageura, Sagamihara, all of Japan

[73] Assignee: Asahi Kasei Kogyo Kabushiki Kaisha, Osaka, Japan

[21] Appl. No.: 96,257

[22] Filed: Sep. 8, 1987

Related U.S. Application Data

[63] Continuation of Ser. No. 827,159, Feb. 7, 1986, abandoned.

[30] Foreign Application Priority Data

| Feb. 9, 1985 [JP] | Japan | 60-22785 |
| Feb. 18, 1985 [JP] | Japan | 60-29955 |
| Apr. 10, 1985 [JP] | Japan | 60-74335 |

[51] Int. Cl.$^4$ .............................................. B01D 53/22
[52] U.S. Cl. .......................................... 55/16; 55/29; 55/158; 204/296; 521/27
[58] Field of Search ............................ 55/16, 29, 158; 204/296; 521/27

[56] References Cited

U.S. PATENT DOCUMENTS

| 3,668,837 | 6/1972 | Gross | 55/158 |
| 3,735,558 | 5/1973 | Skarstrom et al. | 55/16 |
| 3,735,559 | 5/1973 | Salemme | 55/16 |
| 3,817,232 | 6/1974 | Nakajima et al. | 55/158 X |
| 3,909,378 | 9/1975 | Walmsley | 204/296 X |
| 4,267,364 | 5/1981 | Grot et al. | 521/27 X |
| 4,329,434 | 5/1982 | Kimoto et al. | 204/296 X |
| 4,329,435 | 5/1982 | Kimoto et al. | 204/296 X |
| 4,340,680 | 7/1982 | Asawa et al. | 521/27 |
| 4,497,640 | 2/1985 | Fournié et al. | 55/16 |

FOREIGN PATENT DOCUMENTS

| 24175 | 2/1977 | Japan | 521/27 |
| 145343 | 12/1978 | Japan | 55/16 |
| 92027 | 6/1982 | Japan | 521/27 |
| 42626 | 3/1983 | Japan | 521/27 |

*Primary Examiner*—Robert Spitzer
*Attorney, Agent, or Firm*—Birch, Stewart, Kolasch & Birch

[57] ABSTRACT

A permeable polymer membrane, formed of a fluorine type copolymer containing a repeating unit represented by the general formula:

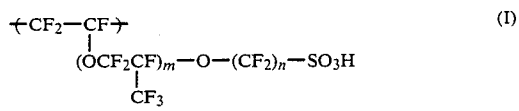

wherein m is 0 or 1 and n is an integer of the value of 2 to 5 and satisfying the relation between the water absorption ratio, W, and the ion-exchange capacity, Q, represented by the following formula:

$$1.20Q - 1.964 < \log W < 1.20Q - 1.742$$

wherein W is $(W_2 - W_1)/W_1$, $W_1$ a dry weight, $W_2$ an equilibrium weight as immersed in pure water at 25° C., and Q an ion-exchange capacity in meq/g of H form dry resin. This permeable polymer membrane is capable of highly desiccating a gas to a low water content. By the use of the extremely desiccated gas, semiconductor elements, semiconductor devices, intermediates thereof, and new components can be produced with outstanding quality. This permeable polymer membrane can be produced by a heat treatment.

18 Claims, 4 Drawing Sheets

PERMEABLE POLYMER MEMBRANE FOR DESICCATION OF GAS

This application is a continuation of application Ser. No. 827,159, filed on 2/7/86, now abandoned.

BACKGROUND OF THE INVENTION

1. Field of the Invention:

This invention relates to an improved fluorine type permeable polymer membrane suitable for desiccation of gases used in the production of semiconductor components such as silicon wafers, gases used in the production of semiconductor devices, gases used in the production of new articles such as fine ceramics, solar cells, and optical fibers and for desiccation of source gases, carrier gases, and ambient gases used in the chemical vapor deposition (CVD) and physical vapor deposition (PVD) methods applied to the formation of ceramic or metallic thin-films on the surface of such substrates as optical components, precision machine components, general machine components, and heat ray-reflecting glass parts, a method for the production of the permeable membrane, a method for the desiccation of the various gases mentioned above, and an apparatus for the formation of a film by the use of the aforementioned permeable polymer membrane.

2. Description of the Prior Art:

It is those semiconductor devices called LSI and VLSI that lead the remarkable growth now taking place in the field of electronics. In the process for the production of their materials and the production of these devices, rare gases such as argon and helium, corrosive gases such as hydrogen chloride and chlorine, and special gases such as silane, arsine, and borane gas are used in addition to such general-purpose gases as nitrogen. Further in the process for the production of semiconductor devices, high integration (superminiaturization) is advancing rapidly.

The lines forming miniature patterns have been gradually losing width and, as a result, the microfine dust particles which have not posed any noticeable problem have been manifesting an increasingly conspicuous influence on the yield of products in proportion to the growing degree of integration of LSI's from the present prevalent level of 256 K bits to 1 megabit and further to 4 megabits.

The gases used in the production of semiconductors mentioned above, specifically the gases used for silicon wafers as substrates of LSI's and for the operations of epitaxial growth, doping, etching, and cleaning in the processes for production of semiconductor devices have reached the point where they are required to possess purity of the order of 4 to 5 time or higher and, in addition thereto, to possess dryness of not more than 1 ppm of water content and enjoy perfect freedom from floating dust particles.

The water present in such a gas induces various hindrances as cited below. The water content, therefore, must be controlled strictly.

(1) The water causes corrosion of such metallic components as pipes, valves, and flowmeters used in the production process of semiconductors and consequent formation of fine metal impurities and fine particles (for example, such corrosive gases as HCl gas).

(2) The water in the furnace for the production of semiconductors is decomposed into $H_2$ and $O_2$ and this $O_2$ particularly gives rise to unexpected oxide impurities.

(3) The gas itself and the entrained water are chemically combined to give rise to by-product impurities.

(4) The surface of the susceptor used in the furnace is damaged to expose graphite.

The high desiccation of a gas mentioned above is important when metallic or ceramic coatings are formed on the surface of such substrates as components in optical devices and components of precision machines. The purity of a gas used in a CVD or PVD method has a serious effect on the construction and physical properties of the coating to be produced. The properties possessed by the produced coating improve in proportion as the purity of the gas is heightened.

At present, the method of adsorption by the use of a molecular sieve is partly adopted for the desiccation of gases to be used in the process for the production of semiconductor devices. The molecular sieve is a desiccant second in adsorbing ability to phosphorus pentoxide and rather readily desiccates an ordinary gas to below 1 ppm of water content.

This particular desiccant has found extensive utility because it has an advantage that, as a physical desiccant, it refrains from inducing such hindrances as deliquescence and swelling. It has a disadvantage, however, that its thermal regeneration necessitates an elevated temperature of 200° to 400° C. and its repeated use after the thermal regeneration entails occurrence of floating dust particles.

Further, the molecular sieve, on exposure to an acid gas such as hydrochloric acid gas, is disintegrated.

Although the molecular sieve is available in its acid-proof grade, the formation of floating dust particles must be prevented. Thus, the molecular sieve inevitably necessitates attachment of a dust filter. In this case, the molecular sieve is no longer regenerable.

As means of desiccating gases, methods which resort to use of polymer membranes are disclosed in U.S. Pat. No. 3,735,558 and the specification of Japanese Patent Application Laid-open Print No. 60,563/1978, for example. Unlike the method of adsorption by the use of the molecular sieve, these methods of permeation through membranes have an advantage that their membranes can be used continuously for a long time without requiring any regeneration.

The former method utilizes a polymer particularly possessing a fluorine type sulfonate group and, therefore, is usable even with a corrosive gas. Neither of the methods, however, are capable of producing a gas having a water content of not more than 1 ppm and fitting a process of producing semiconductors.

The method of adsorption by the use of a disposable grade molecular sieve is not practicable because of a high running cost. Under these circumstances, the development of a method capable of easily producing a gas highly desiccated to not more than 1 ppm of water content at a low running cost without generation of floating dust particles is highly expected by the market.

SUMMARY OF THE INVENTION

This invention provides a permeable polymer membrane formed of a fluorine type copolymer containing a repeating unit represented by the general formula (I):

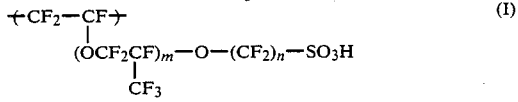

(I)

wherein m is 0 or 1 and n is an integer of the value of 2 to 5 and satisfying the relation between the water absorption ratio, W, and the ion-exchange capacity, Q, represented by the following formula:

$$1.20Q - 1.964 < \log W < 1.20Q - 1.742$$

wherein W is $(W_2 - W_1)/W_1$, $W_1$ a dry weight, $W_2$ an equilibrium weight as immersed in pure water at 25° C., and Q an ion-exchange capacity in meq/g of H form dry resin.

This invention further provides:

a method for the production of a permeable polymer membrane satisfying the aforementioned formula on the relation between W and Q by heating the fluorine type copolymer containing a repeating unit represented by the general formula (I) indicated above;

a method for high desiccation of a wet gas by placing the wet gas in contact with one side of a permeable polymer membrane specified above and either bringing a dry purge gas into contact with the other side of the membrane or reducing the pressure on the aforementioned other side;

a method for etching a semiconductor wafer, a semiconductor device, or an intermediate product by the use of a dry etching grade gas obtained by the method of desiccation described above;

a method for forming an oxide thin-film during the production of a semiconductor wafer, a semiconductor device, or an intermediate product by the use of an ordinary gas and/or a corrosive gas desiccated by the aforementioned method of desiccation;

a method for cleaning the surface of a semiconductor wafer, the CVD unit, and the impurity diffusion furnace during the production of a semiconductor wafer, a semiconductor device, or an intermediate product by the use of the gas desiccated by the aforementioned method of desiccation subsequently to the flow of a raw material gas;

a method for diffusing the impurities on a semiconductor wafer or a compound semiconductor wafer by the use of a doping gas desiccated by the aforementioned method of desiccation during the production of a semiconductor wafer, a compound semiconductor wafer, a semiconductor device, a compound semiconductor device, and/or an intermediate product;

a method for the formation of a thin-film on a substrate under a vacuum or under atmospheric pressure by introducing a raw material gas for the formation of the thin-film and/or a carrier gas into a system holding the substrate under the vacuum or atmospheric pressure thereby coating the substrate with the thin-film, which method is characterized by the fact that the aforementioned raw material gas and/or carrier gas has been desiccated by the aforementioned method of desiccation; and an apparatus for the formation of a thin-film, comprising a film-forming chamber capable of keeping the interior thereof under a vacuum or atmospheric pressure, a gas inlet for introducing a gas from a gas supply source into the film-forming chamber, vacuumizing means capable of evacuating the film-forming chamber of a gas, and water separating means interposed between the gas inlet and the gas supply source, which apparatus is characterized by the fact that the aforementioned water separating means comprises a multiplicity of hollow fibers formed of the aforementioned specific permeable polymer membrane and inserted in a casing, with the opposite ends of the hollow fibers fixed with resin in such a manner that different gases are passable outside and inside the hollow fibers of membrane.

BRIEF DESCRIPTION OF THE DRAWINGS:

In FIGS. 3-5, 1 stands for a hollow-fiber membrane, 2 for a raw material gas inlet, 3 for a raw material gas outlet, 4 for a purge gas inlet (to be closed for vacuumization), 5 for a purge gas outlet (to serve as an evacuating orifice for vacuumization), 6 for a cell, 7 for a partition panel, 8 for a water separating device, 9 for a CVD device or impurity diffusing device, 10 for a varying gas cylinder (a gas supply source), 11 for a cock (a valve), 12 for a target (a cathode), 13 for a substrate (an anode), 14 for a substrate base, 15 for a gas discharge outlet (a connecting orifice to a vacuum pump), 16 for a film-forming chamber, 17 for a gas inlet, and 18 for a PVD device.

DETAILED DESCRIPTION OF THE INVENTION

Figure 1:
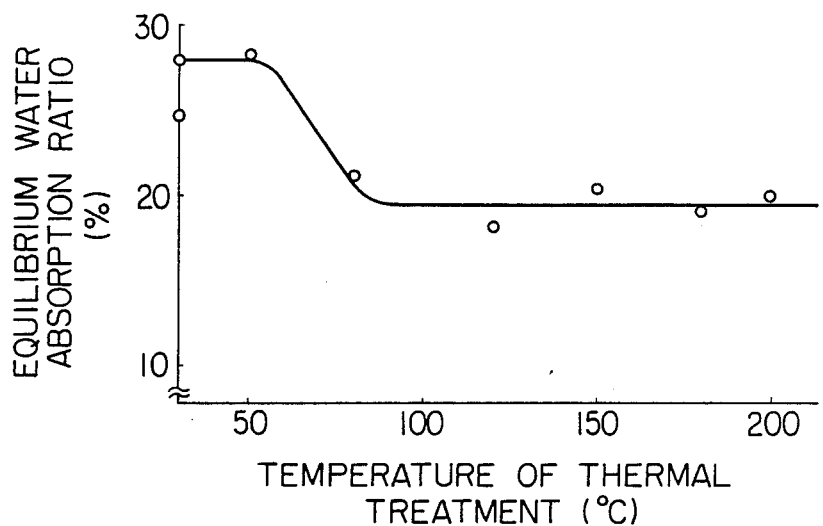
FIG. 1 is a graph showing the relation between the temperature of thermal treatment for desiccation and the equilibrium water absorption obtained of a permeable polymer membrane produced in Example 1.

The permeable polymer membrane of the present invention for high desiccation of a gas is formed of a fluorine type copolymer containing a repeating unit represented by the general formula (I):

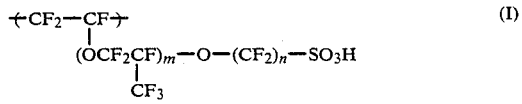

(I)

wherein m is 0 or 1 and n is an integer of the value of 2 to 5 and satisfying the relation between the water absorption ratio, W, and the ion-exchange capacity, Q, represented by the following formula:

$$1.20Q - 1.964 < \log W < 1.20Q - 1.742$$

wherein W is $(W_2-W_1)/W_1$, $W_1$ a dry weight, $W_2$ an equilibrium weight as immersed in pure water at 25° C., and Q an ion-exchange capacity in meq/g of H form dry resin.

The fluorine type copolymer mentioned above is desired to be formed by copolymerizing a fluorinated olefin such as tetrafluoroethylene, trifluoroethylene, perfluorovinyl ether, vinylidene fluoride or vinyl fluoride with a perfluorovinyl ether monomer represented by the formula:

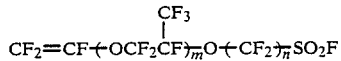

wherein m is 0 or 1 and n is an integer of the value of 2 to 5.

Concrete examples of the copolymer meeting this requirement are indicated in U.S. Pat. Nos. 4,329,434, U.S. 4,329,435, and U.S. 3,909,378.

The inventors have found that, of the membranes formed of the fluorine type copolymers containing a repeating unit represented by the general formula (I), permeable polymer membranes which satisfy the relation between the water absorption ratio, W, and the ion-exchange capacity, Q, represented by the following formula:

$$1.20Q - 1.964 < \log W < 1.20Q - 1.742$$

wherein W is $(W_2-W_1)/W_1$, $W_1$ a dry weight, $W_2$ an equilibrium weight as immersed in pure water at 25° C., and Q an ion-exchange capacity in meq/g of H form dry resin, produce an excellent effect in thoroughly desiccating a gas.

The amount of the sulfonate group incorporated in the aforementioned fluorine type copolymer is desired to fall in the range of 0.5 to 2.5 meq/g of H form dry resin in terms of ion-exchange capacity. By limiting the ion-exchange capacity of the fluorine type copolymer to the range of 0.5 to 2.5 meq/g of H form dry resin, the polymer membrane can be easily produced without notably lowering the speed of permeation of steam or excessively increasing the melting point of the copolymer and the polymer membrane can retain its shape stably without a sacrifice of physical strength thereof.

Preferably, the ion-exchange capacity falls in the range of 0.8 to 1.8 meq/g of H form dry resin.

The membrane of the fluorine type copolymer may be in the shape of a flat sheet, a tube, or a hollow fiber. Among other shapes of membrane, the following fiber proves particularly desirable because of large membrane surface area and high treating ability per unit volume.

For the purpose of attaining the desiccation at a high degree, the airtightness of the apparatus counts strongly. Also in this respect, the hollow-fiber membranes proves desirable.

The thickness of the hollow-fiber membrane is desired to be as small as possible because the membrane's ability to pass steam and its performance improves with the decreasing thickness. The smallest possible thickness of this membrane is fixed by such factors as moldability and pressure-resisting property. The thickness of the membrane is variable with the diameter of the hollow fiber. It is desired to fall in the range of 40 to 60 $\mu$m when the hollow fiber has an inside diameter in the range of 400 to 500 $\mu$m, for example.

The membrane of this invention is produced by forming the fluorine type copolymer described above in the shape of a thin-film, then hydrolyzing the thin-film with an alkali, treating the hydrolyzed thin-film with a strong acid thereby converting the terminal group, $SO_2F$, of the copolymer to $SO_3H$, and thereafter subjecting the copolymer to a thermal treatment.

The thermal treatment may be carried out, when necessary, by keeping the site of treatment purged with a dry gas such as, for example, nitrogen gas having a water content of not more than 2.5 ppm or keeping the site of treatment under a vacuum. The proper temperature of the thermal treatment is in the range of 60° to 250° C. If the temperature is excessively high, there ensues a possibility that the copolymer will be deprived of the ion-exchange group and consequently of the performance. Preferably, the temperature of the thermal treatment is in the range of 70° to 200° C.

By the thermal treatment, the copolymer is caused to undergo shrinkage of some tens of percent and drop of water absorption ratio. As a result, the produced membrane satisfies the relation between the water absorption ratio, W, and the ion-exchange capacity, Q, represented by the following formula:

$$1.20Q - 1.964 < \log W < 1.20Q - 1.742$$

wherein W is $(W_2-W_1)/W_1$, $W_1$ a dry weight, $W_2$ an equilibrium weight as immersed in pure water at 25° C., and Q an ion-exchange capacity in meq/g of H form dry resin.

The membrane resulting from the thermal treatment desiccates a gas to a level of not more than 5 ppm of water content and further to a level of not more than 1 ppm of water content. In this sense, it is logical to conclude that the membrane obtained by the thermal treatment of the aforementioned copolymer is capable of desiccating a gas to an ultimate level unthinkable by the common knowledge on conventional membranes.

The gas to be desiccated may be supplied to either side of the membrane of the fluorine type copolymer. By sweeping the other side of the membrane with a dry purge gas of a lower water content or by reducing the pressure with a vacuum pump, the partial pressure difference which is the driving force for membranous permeation is generated and the desiccation aimed at is accomplished.

The dry purge gas of a lower water content is supplied for the purpose of depriving the gas under treatment of the contained water across the membrane and, therefore, is desired to be an inert gas, which reactivity is as low as possible at elevated temperatures. The term "vacuum" as used herein means a pressure lower than the atmospheric pressure, though variable with the pressure of the gas to be supplied.

The membrane of the present invention is produced by the thermal treatment. In the case of a flat membrane, whether the membrane has been produced by the thermal treatment or not can be readily decided by testing the membrane for its water absorption ratio.

In the case of a membrane in the shape of a thin hollow fiber, since the water absorption ratio is not easily measured, the decision can be attained by testing the membrane for a temperature for starting thermal shrinkage to be described below.

Figure 6:
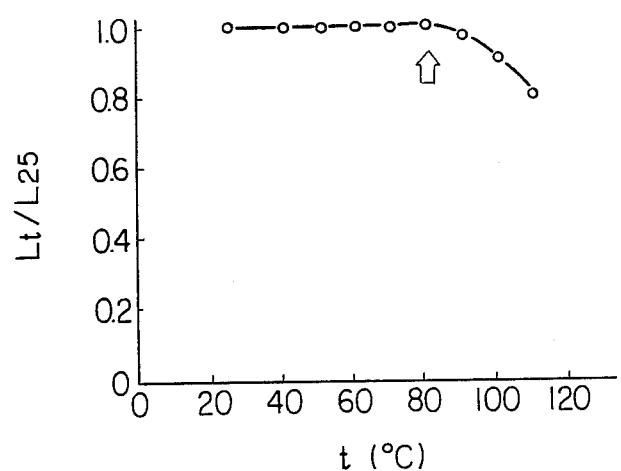
FIG. 6 is a graph showing the relation between the change of fiber length and the temperature and FIG. 7 is a graph showing the relation between the highest temperature involving no thermal shrinkage and the temperature of thermal treatment.
Figure 7:
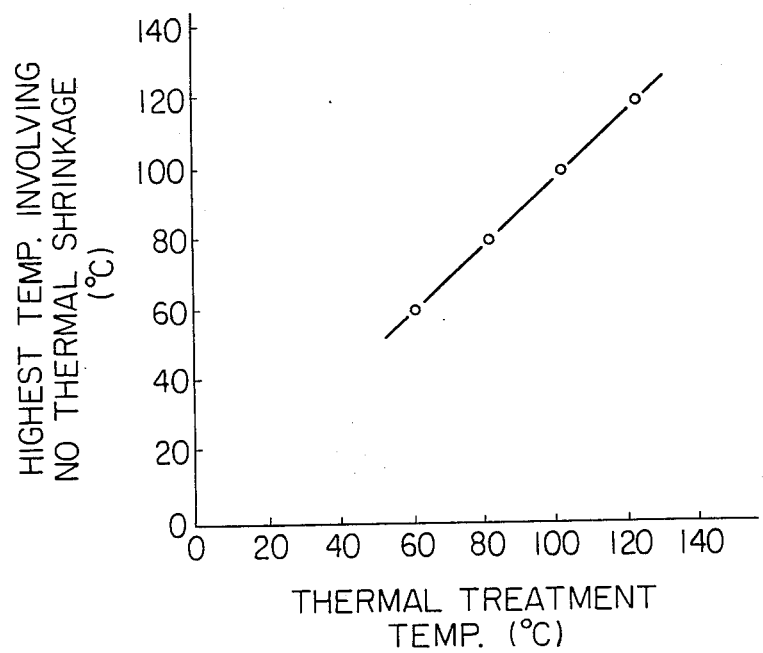

A sample of hollow-fiber membrane, with a light weight (heavy enough to pull the fiber straight but not heavy enough to stretch the fiber) hung down from the lower end thereof, is suspended in an air tank. The temperature of the air tank is gradually elevated and the change in the length of the fiber is measured with a reading microscope. Typical results of this measurement are shown in a graph of FIG. 6, wherein the horizontal axis is the scale of temperature and the vertical axis the scale of fiber length. In the graph, $L_{25}$ denotes a length at 25° C. and $L_t$ a length at the temperature of t° C. With reference to FIG. 6, the temperature indicated by the arrow, i.e. the highest temperature at which no change of length is caused by elevation of temperature, is defined as "the highest temperature involving no thermal shrinkage." A few samples of hollow-fiber membranes obtained at different temperatures of thermal treatment (t) were tested for their "highest temperatures (T) involving no thermal shrinkage." The results are shown in FIG. 7. The graph indicates the following relation.

$$T = t \quad (1)$$

Thus, the temperature of thermal treatment (t) of a given hollow-fiber membrane can be found by measuring the highest temperature (T) involving no thermal shrinkage.

The gas to be desiccated by the method of the present invention is generally a gas which is marketed as contained in a cylinder. This gas has no appreciably high steam content. The steam content of the gas so contained in the cylinder is generally in the range of several ppm to some tens of ppm. At times, the steam content exceeds 100 ppm. Depending on the steam content of a given gas, the surface area of the membrane in the water separating device or the number of membranes used in the device may be suitably varied to effect desiccation to a desired level.

The gas to be used for the method of etching of this invention may be any of the gases heretofore used for etching. Concrete examples of such conventional gases are HCl, $CF_4$, $C_2F_6$, $CBrF_3$, $CF_3Cl$, $CF_2Cl_2$, $NF_3$, $O_2$, $C_3F_8$, $C_4F_8$, $CHF_3$, $BCl_3$, $CCl_4$, $Cl_2$, $Br_2$, HBr, and $SiCl_4$.

The gas to be used for the method of formation of an oxide thin-film contemplated by this invention is an ordinary gas or a corrosive gas. Concrete examples of the ordinary gas include $O_2$, $N_2O$, $H_2$, $N_2$, and Ar, and concrete examples of the corrosive gas include HCl, $Cl_2$, and $Br_2$.

The gas to be used in the method of cleaning according to this invention can be a cleaning gas, a reducing gas, a carrier gas, or a balance gas. Examples of the cleaning gas are HCl gas, $SiCl_4$, $SiH_4$, $Si_2H_6$, $SiH_2Cl_2$, and $SiHCl_3$. Examples of the reducing gas are $H_2$ and $ZnCl_4$ gas. Examples of the carrier gas and the balance gas are $H_2$, $N_2$, He, and Ar. The cleaning gases cited above may be used as mixed with reducing gases, carrier gases, and balance gases.

In the method of diffusion of impurities, there is used a corrosive doping gas. Concrete examples of the corrosive doping gas include $B_2H_6$, $AsH_3$, $PH_3$, $BCl_3$, $SiH_4$, $GeH_4$, $H_2Se$, $PCl_3$, $PF_2$, $AsCl_3$, $H_2S$, $SiF_4$, $SF_6$, $POCl_3$, $BF_3$, $BBr_3$, $SeH_2$, $SbH_3$, $AsF_3$, $(CH_3)_2Te$, $(C_2H_5)_2Te$, $(CH_3)_2Cd$, and $(C_2H_5)_2Cd$, and mixtures of these gases. Among other corrosive doping gases cited above, diborane gas, arsine gas, phosphine gas, boron trichloride gas, and mixtures thereof are generally used frequently.

Examples of the gases usable in the growth of thin-film or diffusion of impurities by the method of the organic metal vapor deposition include $AsH_3$, $AsCl_3$, $PCl_3$, $PH_3$, HCl, $H_2$, $N_2$, $H_2Se$, $H_2S$, $H_2Te$, $(CH_3)_3Ga$, $(C_2H_5)_3Ga$, $(C_2H_5)_2GaCl$, $(CH_3)_3Al$, $(C_2H_5)_3Al$, $(CH_3)_3In$, $(C_2H_5)_3In$, $(C_2H_5)_2Zn$, $(CH_3)_2Zn$, $(CH_3)_2Cd$, $(C_2H_5)_2Cd$, $(CH_3)_2Hg$, $(CH_3)_4Sn$, $(C_2H_5)_4Sn$, $(CH_3)_4Pb$, and $SbH_3$, and mixtures thereof.

Among the gases which can be desiccated by the method for desiccation of a gas according to this invention is included an epitaxial gas. Concrete examples of the epitaxial gas include HCl, $PH_3$, $B_2H_6$, $SiCl_4$, $SiH_2Cl_2$, $SiHCl_3$, $SiH_4$, $Si_2H_6$, $SiI_4$, $SiI_2$, $SiF_4$, $SnCl_4$, $SbCl_5$, $GeH_4$, $GeCl_4$, $GeI_4$, $GeI_2$, $TeH_2$, $BBr_3$, $BCl_3$, $PCl_3$, $AlCl_3$, $AsCl_3$, $(CH_3)_3Al$, $(C_2H_5)_3Al$, $(CH_3)_3Sb$, $(C_2H_5)_3Sb$, $(CH_3)_3Ga$, $(C_2H_5)_3Ga$, $(CH_3)_3As$, $(C_2H_5)_3As$, $(CH_3)_2Hg$, $(C_2H_5)_3Hg$, $(CH_3)_3P$, and $(C_2H_5)_3P$, and mixtures thereof. Among other epitaxial gases enumerated above, hydrogen chloride gas, phosphine gas, diborane gas, tetrachlorosilane gas, trichlorosilane gas, dichlorosilane gas, and mixtures thereof are generally used frequently.

In the CVD version of the method for forming a thin-film on a substrate, a raw material (source) gas, a carrier gas, etc. are used. Examples of the thin-film deposited as a coating on the surface of the substrate by the CVD method are shown below together with their respective raw material (source) gas and carrier gas: Carbides such as BeC (source: $BeCl_3 + C_6H_5CH_3$, carrier gas: $H_2$), SiC (source: $SiCl_4 + CH_4$, carrier gas: $H_2$), ZrC (source: $ZrCl_4 + C_6H_6$, carrier gas: $H_2$), $B_4C$ (source: $BCl_3 + C_6H_5CH_3$, carrier gas: $H_2$), and WC (source: $WCl_6 + C_6H_5CH_3$, carrier gas: $H_2$), nitrides such as BN (source: $BCl_3$, carrier gas: $N_2 + H_2$), TiN (source: $TiCl_4$, carrier gas: $N_2 + H_2$), ZrN (source: $ZrCl_4$, carrier gas: $N_2 + H_2$), HfN (source: $HfCl_4$, carrier gas: $N_2 + H_2$), VN (source: $VCl_4$, carrier gas: $N_2 + H_2$), TaN (source: $TaCl_5$, carrier gas: $N_2$), $Be_3N_2$ (source: $BeCl_3$, carrier gas: $N_2 + H_2$), AlN (source: $AlCl_3$, HCl, carrier gas: $N_2 + H_2$), and $Th_3N_4$ (source: $ThCl_4$, carrier gas: $N_2 + H_2$), borides such as AlB (source: $AlCl_3 + BCl_3$, carrier gas: $H_2$), SiB (source: $SiCl_3 + BCl_3$, carrier gas: $H_2$), $TiB_2$ (source: $TiCl_4 + BBr$, carrier gas: $H_2$), $ZrB_2$ (source: $ZrCl_4 + BBr_3$, carrier gas: $H_2$), $HfB_2$ (source: $HfCl_4 + BBr_3$, carrier gas: $H_2$), $VB_2$ (source: $VCl_4 + BBr_3$, carrier gas: $H_2$), TaB (source: $TaCl_5 + BBr_3$, carrier gas: $H_2$), and WB (source: $WCl_6 + BBr_3$, carrier gas: $H_2$), silicides such as MoSi (source: $MoCl_5 + SiCl_4$, carrier gas: $H_2$), TiSi (source: $TiCl_4 + SiCl_4$, carrier gas: $H_2$), ZrSi (source: $ZrCl_4 + SiCl_4$), and VSi (source: $VCl_3 + SiCl_4$, carrier gas: $H_2$), and oxides such as $Al_2O_3$ (source: $AlCl_4$, HCl, carrier gas: $H_2 + CO$), $SiO_2$ (source: $SiCl_4$, $SiH_4 + O_2$, carrier gas: $H_2 + CO$), $Fe_2O_3$ (source: $Fe(CO)_5$, carrier gas: $H_2 + CO$), and $ZrO_2$ (source: $ZrCl_4$, carrier gas: $H_2 + CO$) in addition to TiC and TiN mentioned above.

For a purpose slightly different from the purpose described above, there may be formed a thin-film of a single metal or alloy on the surface of a substrate.

Examples of the thin-film of a single metal include Cu (source: $CuCl_3$, carrier gas: $H_2$ or Ar), Be (source: $BeCl_3$, carrier gas: $H_2$), Al (source: $AlCl_3$, carrier gas: $H_2$ or Ar), Ti (source: $TiCl_4$, carrier gas: $H_2$ or Ar), Zr (source: $ZrCl_4$, carrier gas: $H_2$ or Ar), Ge (source: $GeI_2$, carrier gas: $H_2$ or Ar), Mo (source: $MoCl_5$, carrier gas:

$H_2$), W (source: $WCl_6$, carrier gas: $H_2$), Si (source: $SiCl_4$, $SiH_2Cl_2$, carrier gas: $H_2$), B (source: $BCl_3$, carrier gas: $H_2$), Pt (source: $(PtCl_2)_2(CO)_3$, carrier gas: Ar or He), and Pb (source: $Pb(C_2H_5)_4$, carrier gas: Ar or He).

Examples of the thin-film of an alloy include Ta-Tb (source: $TaCl_5+NbCl_5$, carrier gas: Ar or He), Ti-Ta (source: $TiCl_4+TaCl$, carrier gas: Ar or He), Mo-W (source: $MoCl_6+WCl_6$, carrier gas: Ar or He), and Cr-Al (source: $CrCl_3+AlCl_3$, carrier gas: Ar or He).

Examples of the gas to be used in the PVD version of the method for forming a thin-film on a substrate include Ar, $O_2$, $N_2$, $CH_4$, $C_2H_2$, CO, $H_2S$, $SiH_4$, $PH_3$, and mixtures thereof. Among other gases cited above, Ar gas is generally used most popularly.

The semiconductor wafers to which the present invention is applicable are represented by silicon wafers. The compound semiconductors to which this invention is applicable include semiconductors formed of elements of Group III and elements of Group V in the periodic table in addition to semiconductors formed of elements of Group II and elements of Group VI in the same table. At present, increasingly conspicuous growth is being attained by the compound semiconductors of the III-V groups such as GaAs and GaAlAs in the place of those of the II-IV groups. The number of binary compounds between B, Al, Ga, and In of the Group III and N, P, As, and Sb of the Group V is 16. All these binary compounds possess effective and characteristic physical properties not found in the semiconductors of elements of Group IV such as Si and Ge. Further, ternary, quaternary, and higher compounds of the elements of Group III and Group V are also producible by synthesis. While the number of compounds to be so formed grows with the increasing number of elements involved in the combination, the properties of the produced compounds depend on their combinations of elements. Some of the binary compounds among the compound semiconductors of the III-V groups are obtainable in the form of crystals grown from their molten solutions. More often than not, such crystals are found to contain impurities and lattice defects. Thus, the method of vapor-phase epitaxial growth which most suits commercialization of semiconductor elements is believed to constitute an important technique in the future.

The term "semiconductor device" as used herein means all the devices of IC's and LSI's formed of the aforementioned semiconductors and the term "compound semiconductor device" all the devices of IC's and LSI's formed of the aforementioned compound semiconductors. The term "intermediate" as used herein means half-finished products to be obtained during the course leading to the final step in which the semiconductor devices are finished.

Among the semiconductor devices to which the present invention is applicable are counted solar cells. Generally, the solar cell is produced by a procedure which comprises (1) doping a silicon wafer with an n-type impurity such as P (phosphorus) or As (arsenic), (2) doping the n-doped wafer with a p-type impurity such as B (boron), (3) superposing a metal such as Au, Ni, or Sn on the p-type region of the doped wafer by vacuum deposition or thermal formation of alloy, and (4) superposing a reflectionproof coating such as SiO on the light-receiving surface of the wafer by vacuum deposition. The present invention is applied to the aforementioned steps of doping.

The term "dry etching" as used herein means an operation of chemically etching substrates of silicon, polysilicon, $Si_3N_4$, photoresist, $SiO_2$, PSG, Al, Mo, W, and Ti by the use of a gas in the production of semiconductor wafers or semiconductor devices.

In cleaning a semiconductor wafer, a CVD device, and an impurity diffusing furnace, in preparation for the epitaxial growth by thermal decomposition, the silicon wafer is baked at an elevated temperature with the $H_2$ gas desiccated by the aforementioned specific membrane to effect removal of a natural oxide ($SiO_2$) layer. Then, the HCl gas amply desiccated by the aforementioned specific membrane is passed through the interior of the CVD device to effect etching of the silicon wafer (through removal of surface defects and defilements and consequent refining of surface). The cleaning is completed by purging the semiconductor wafer and the devices with the thoroughly desiccated HCl gas until the residual halogen component is removed. The epitaxial growth and the diffusion of impurities are started after the devices have been cleaned by the treatments described above. In cleaning the interior of the impurity diffusing furnace, the HCl gas amply desiccated by the aforementioned specific membrane is similarly passed through the interior of the furnace to remove the impurities adhered to the inner wall of a quartz tube.

The cleaning of a silicon substrate by the reduction with hydrogen is attained by mixing the $H_2$ gas desiccated to a water content of not more than 5 ppm by the aforementioned specific membrane with $SiCl_4$ until saturation and passing the resultant mixed gas through the interior of the CVD device, with the temperature of the wafer controlled in the range of 1,150° to 1,300° C. The cleaning of the interior of the CVD device and that of the impurity diffusing furnace are carried out in the same manner as in the aforementioned thermal decomposition.

In recent years, for the purpose of permitting collective treatment of a larger number of semiconductor wafers, semiconductor devices, or intermediates, the trend toward adoption of a larger device such as, for example, a device provided with a quartz cylinder or a device making use of a vertical bell jar of metal or quartz in addition to the aforementioned quartz tube is gaining in popularity. In the production of semiconductor wafers, semiconductor devices, or intermediates by the use of such new devices, the method of the present invention can be advantageously utilized. Further in the production of semiconductor wafers, semiconductor devices, and intermediates, efforts are made to enlarge the size of these products and increase the thickness of the thin-films formed thereon. As a natural consequence, the excess Si and impurities suffered to accumulate in the susceptors, quartz tubes, quartz cylinders, and bell jars of metal or quartz used in the devices employed for their production grow in volume. In the cleaning of these tubes, cylinders, and bell jars, the method of the present invention can be advantageously utilized.

For efficient cleaning of the semiconductor wafers or semiconductor devices of enlarged size and increased film thickness and of the devices adopted for their production, it is desirable to combine the cleaning which is given for each batch of operation (to effect cleaning of the surface of the semiconductor wafer) and the cleaning which is carried out intermittently at fixed intervals of time or number of batches (to effect removal of Si and other impurities accumulated on or adhering to the interiors of such devices as quartz tubes, quartz cylinders, and bell jars of metal or quartz and on the susceptors inside the devices). Recently, there is a growing tendency of adopting the practice of the intermittent cleaning mentioned above.

In the CVD version of the method of forming a coating in accordance with this invention, the deposition of a coating of titanium carbide (TiC) on the surface of a steel substrate is carried out by using methane gas as a carbon source and hydrogen as a carrier gas. In this case, the following reactions proceed during the course of chemical deposition.

$$TiCl_4 + CH_4 + H_2 \rightarrow TiC + 4HCl + H_2 \quad (1)$$

$$CH_4 \rightleftharpoons C + 2H_2 \quad (2)$$

$$TiCl_4 + 2Fe + C \rightarrow TiC + 2FeCl_2 \quad (3)$$

$$TiCl_4 + C\text{ (Solid)} + 2H_2 \rightarrow TiC + 4HCl \quad (4)$$

The temperature of the decomposition generally is in the neighborhood of 1,000° C. and the coating time is several hours. When the coating is to be made of TiN, there are used $TiCl_4$, $N_2$, and $H_2$.

In the present invention, the superposition of the coating on the substrate is carried out under a vacuum or under atmospheric pressure. For the CVD reactions, the reaction pressure may well be called an important factor. The speed of precipitation is increased and the crystal grains are coarsened in proportion as the reaction pressure is increased. To obtain a quality coating of fine crystals, the CVD treatment is desired to be carried out under a vacuum.

The quality of the substrate in use heavily affects the coating to be obtained. In the superposition of a TiC coating on a steel substrate, for example, the substrate is required to have a high carbon content, to acquire a high core hardness during a thermal treatment, and to suffer from no appreciable deformation during the thermal treatment.

For the coating with TiC or TiN, hard metals of the grades of SKH 9, SKH 55, and SKH 57 are used as substrates; for the coating of punches and dies in the field of cold forging, hard metals of the grades of SKD 1, SKD 11, and SKH 9 are used as substrates; for the coating of piercing punches, dies, and shearing molds in the field of sheet metal working, hard metals of the grades of SKD 1 and SKD 11 are used as substrates; for the coating of powder compressors and core loads in the field of powder molding, hard metals of the grades of SKH 9, SKH 55, and SKH 57 are used as substrates; for the coating of reamers, taps, cutting tools, drills, and cutters in the field of cutting works, hard metals of the grades of SKD 1 and SKD 11 are used as substrates; for the coating of extrusion screws, torpedoes, rings, and nozzles in the field of plastic molding, hard metals of the grades of SKS 2 and 3, SK 2, 3, and 4, and SUJ 1, 2, and 3 are used as substrates; for the coating of thread guides, yarn guides, and cutters in the textile field, hard metals of the grades of SKD 1 and SKD 11 are used as substrates; and for coating drill guide bushes and plug gauges in the field of auxiliary tools, similar hard metals are used as substrates.

The aforementioned method of coating is also advantageously utilized in superposing a coating of diamond on a substrate. The coating of diamond can be formed, for example, by the electron-beam CVD method. This method comprises decomposing a hydrocarbon with an electron beam and causing the formed carbon to be precipitated in such a manner as to form the crystalline structure of diamond. Among other hydrocarbons, methane ($CH_4$) proves to be a desirable raw material for the coating of diamond because it possesses the structure of a normal tetrahedron and, therefore, has a fair possibility of promoting crystalline growth while keeping the tetrahedral structure intact. The coating of diamond produced by the procedure described above acquires high quality when the hydrocarbon is used as extremely desiccated by the method of the present invention.

Further in accordance with this invention, a coating of amorphous silicon (a-Si) of high quality can be formed. As devices utilizing a-Si coatings, electrophotographic sensitive materials and solar cells have been known. The formation of a-Si coatings can be attained by the glow discharge method and the CVD method, for example. The a-Si coatings formed by these methods acquire high quality when the raw material gas, the carrier gas, and the ambient gas to be used in such methods are extremely desiccated in advance by the method of this invention.

By the glow discharge method, for example, the a-Si coating is formed by causing $SiH_4$ to be decomposed in the plasma generated by glow discharge. It is also possible to form a coating of an amorphous silicon-fluorine-hydrogen alloy (a-Si:F:H) by using $SiF_4$ as the raw material in combination with hydrogen or $SiH_4$. By the CVD method, the a-Si coating is precipitated by thermally decomposing $SiH_4$ under atmospheric pressure at a temperature in the range of 400° to 700° C. To ensure through combination of hydrogen with Si, the treatment is effected in a plasma of hydrogen.

The method for the formation of a thin-film according to this invention can be advantageously utilized in the production of an optical fiber matrix by the internal CVD (internal chemical vapor deposition) method. In the internal CVD method, raw material gases (raw material for glass in the vapor phase and a doping material in the vapor phase) and $O_2$ gas are supplied into a glass pipe of quartz and, at the same time, the interior of the glass pipe is heated with a heat source such as an oxyhydrogen flame burner disposed to be reciprocated in the longitudinal direction of the glass pipe. Owing to the ensuing oxidation of the aforementioned raw material gases and the vitrification of the reaction product, a glass layer is accumulated inside the glass pipe. The glass layer so deposited inside the quartz type glass pipe is enabled to acquire outstanding physical properties when the raw material gases are used as desiccated by the method of this invention.

The raw material glass supplied in the vapor phase into the glass pipe is $SiCl_2$ and the doping material in the vapor phase is $GeCl_4$ or $POCl_3$, for example.

By one reciprocation of the burner, a synthetic glass coating 10 $\mu$m in thickness is formed inside the quartz glass pipe. The desired glass coating as a core can be obtained in a fixed thickness (100 to 300 $\mu$m) by repeating the reciprocation of the burner as many times as required. The optical fiber matrix is obtained by fusing a plurality of quartz glass pipes having a glass core coating deposited therein in the usual way.

Now, the uses found for the thin-film-forming materials which are obtained by the method of this invention will be described below.

The oxide thin-film-forming materials such as $Al_2O_3$, MgO, and $ZrO_2$ invariably excel in heat resistance (1,700° to 2,200° C.) and strength (2,000 Kg/cm, 1,200° C.) and, therefore, are utilized advantageously for coating cutting tools.

The carbide thin-films such as SiC, WC, $B_4C$, and TiC possess high melting points (2,100° to 3,100° C.), high levels of hardness (2,500 to 2,800 kg/mm$^2$), high degrees of thermal conductivity (0.04 to 0.10 cal/cm-sec-°C.), and high abrasion resistance and, therefore, are utilized advantageously on hard-metal tools for mechanical seals. A thin-film of TiC formed on carbon fibers serves to enhance the strength and durability of the carbon fibers greatly.

The thin-films of such nitrides as $Si_3N_4$, AlN, and BN possess high durability and high rigidity and excel in resistance to corrosion and thermal shock and, therefore, find utility in the same applications as the thin-films of the aforementioned carbides.

The thin-films of such borides as $TiB_2$, $ZrB_2$, and $CrB_2$ possess high melting points (2,760° to 3,040° C.) and high levels of hardness (1,700 to 3,400 kg/mm$^2$), excel in mechanical strength and corrosion-proofness, exhibit high degrees of electric conductivity, and enjoy prominent metallicity and, therefore, are advantageously utilized in coating containers for molten metals and coating high-temperature electronic materials.

Boron fibers can be produced by using core wires of tungsten as substrates and coating boron on the substrates by the CVD method using boron chloride and hydrogen gas. In this case, carbon fibers may be as core wires. Boron type fibers prevented from reacting with metals are obtained by having a thin-film of silicon carbide superposed on the surface of the boron fibers by the CVD method. These fibers produced by the CVD method are enabled to acquire enhanced strength and increased resistance to heat when the raw material gases and carrier gases to be used therefor are amply desiccated in advance by the method of this invention.

Besides the substrate mentioned above, all the substrates to which the CVD method is effectively applicable can be coated by the method for the formation of a thin-film contemplated by this invention. Thus, this method can be advantageously utilized for coating various mechanical members used in nuclear power plants, optical products, abradants, parts for aircraft, automobiles, electric trains, and ships, turbine parts, reaction devices, and catalytic electrodes.

Now, the PVD version of the method for the formation of a thin-film contemplated by this invention will be described below.

Broadly the PVD method is divided into vacuum deposition, sputtering, ion plating, etc. Each of the techniques has many variations. All these techniques share one common principle that a material chemically identical with a thin-film desired to be formed is evaporated in a vacuum and the vapor of this material is deposited on a substrate which is opposed to the source of the vapor. When the thin-film is to be formed of an alloy, the alloy itself may be directly vaporized or the component metals of the alloy may be separately vaporized and the different vapors combined to form the alloy during the course of their deposition on the substrate. In the sputtering technique, the ions such as of argon which impinge on a target at a high speed cause atoms of the target to fly out and land on a substrate mounted on an opposite electrode. Numerous variations of the sputtering technique are invariably based on the phenomenon of sputtering of a target material caused by the ions of argon. In the reactive sputtering technique, the formation of an insulating thin-film on a substrate is attained by one type of chemical reaction which is caused by introducing oxygen, nitrogen or other gases into the system and using a silicon material as the target. As specific PVD techniques in the process for production of semiconductors, the electron beam deposition technique which is one form of the vacuum deposition technique and the magnetron sputtering technique which is one form of the sputtering technique are frequently used.

In the method for the formation of a thin-film according to the present invention, the coating on a substrate is formed by using a gas which has been desiccated to a water content of not more than 5 ppm by using the aforementioned membrane of high desiccating ability. The coating is formed within a PVD device by introducing into the device the gas amply desiccated as described above.

The reactive sputtering technique, among other forms of the sputtering technique, attains the formation of the thin-film by admixing a discharge gas used for the sputtering with a reactive gas. Owing to this particular technique, it has now become possible to form a compound thin-film on a substrate. Specifically, when a TiC thin-film is desired to be deposited on a substrate of Al alloy, the deposition of the TiC thin-film on the Al alloy substrate is attained without fail by depositing a Ti thin-film on the substrate with the use of a discharge gas of Ar solely against the target of Ti instead of directly depositing a TiC thin-film on the substrate and thereafter adding $CH_4$ gradually to the Ar discharge gas thereby changing the composition of the thin-film in growth from Ti to TiC. The fastness of this deposition may be logically explained by the postulate that Ti plays the part of an adhesive agent between the Al alloy and TiC. The gradient composition of this kind is believed to contribute to mechanical utilization of a thin-film. Concrete examples of the material for the thin-film to be formed by the reactive sputtering include metals, semiconductor oxides, nitrides, carbides, silicides, and phosphorus compounds. The target of sputtering may be made of any of virtually all metals and semiconductors, so that even oxides of Ag, Ar, and Pt can be formed by the sputtering. As the reactive gas, $O_2$ and others are used for oxides; $N_2$, $NH_3$, etc. for nitrides; $CH_4$, $C_2H_2$, CO, etc. for carbides; $H_2S$ and others for sulfides, $SiH_4$ and others for silicides; and $PH_3$ and others for phosphorus compounds. These gases may be used singly or used as admixed with Ar gas.

Specific examples of the compound thin-films produced by the reactive sputtering are as follows:
Oxides:
  $Al_2O_3$, $Cr_2O_3$, $In_2O_3$, $SiO_2$, $SnO_2$, $Ta_2O_2$, $TiO_2$, $VO_2$, $WO_3$, $ZnO$, $In_2O_3$, and $SnO_2$
Nitrides:
  AlN, NbN, $Si_3H_4$, TaN, TiN, and ZrN
Carbides:
  FeC, SiC, TaC, TiC, VC, and WC
Sulfides:
  CdS, CuS, $MoS_2$, and PbS
Silicides:
  Cr-Si, Fe-Si, Mo-Si, Ta-Si, Ti-Si, and W-Si
Phosphorus compound:
  InP The technique of producing a solar cell or an electrophotographic sensitive material by forming an amorphous silicon (a-Si) coating by the reactive sputtering or ion plating treatment has been attracting growing attention. The present invention can be effectively applied to this technique. To be more specific, the reactive sputtering technique effects the formation of the a-Si coating by applying an electric power between electrodes placed in argon gas of low pressure (which has been desiccated by the present invention) thereby causing electric discharge therebetween, allowing the discharge gas to sputter a crystalline silicon plate (target) disposed on one of the electrodes, adding $H_2$ or $SiF_4$ (which has been desiccated by the present invention) to the argon gas during deposition of a silicon coating on the substrate placed on the other electrode. $B_2H_2$ or $PH_3$ is added to the discharge gas being used for the sputtering to add impurity elements. By the ion plating technique, the formation of the a-Si coating is effected by vaporizing solid silicon with an electron beam in a vacuum, leading the vaporized silicon into plasma formed inside a vacuum container thereby ionizing the vaporized silicon and, at the same time, allowing the ionized silicon to react with hydrogen (which has been desiccated by the present invention). Here, the ionized particles are accelerated and precipitated in the direction of the substrate by the DC voltage applied between the source of vaporization and the substrate. The formation of plasma can be attained by a method using a DC field or by a method using a high frequency field.

In view of the above description, the present invention has the following novelty:

(1) Heretofore, substantially no apparatus could desiccate corrosive gases to a low water content of less than several ppm, or not more than 1 ppm depending on the conditions applied. Such an apparatus has been realized for the first time by a water separator employing a membrane according to the present invention.

(2) The molecular sieve is broken by an acid gas such as HCl and, as a result, floating dust is generated. In a thermal regeneration process of the molecular sieve, the temperature is required to be raised to fall in the range of 200° to 400° C. By the repeated thermal regeneration, floating dust is generated but, the water separator with the membrane of this invention represses the generation of floating dust.

(3) The molecular sieve has been used broadly as a reasonable desiccating agent to decrease comparatively easily the water content of a general industrial gas to not more than 1 ppm but it requires a troublesome treatment in the thermal regeneration. The water separator with the membrane, however, endures a long continuous use, its treating cost per unit of gas is low, and its use in the desiccating process is very convenient.

(4) Heretofore, a membrane has been used for desiccation of gases of rather low purity and for their adjustment. The water separator of the present invention is capable of removing the water content of gases to the minimum which could not be attained by the prior art. Based on this ability, the device of the present invention can be adopted in the field of delicate processing such as the production of semiconductors and intermediates thereof.

(5) In the desiccation of a gas with a membrane heretofore employed, a gas often employed to pass on the side to be permeated suffers from a large loss of pressure during its permeation through the membrane and extra costs are often needed to increase the pressure. The water separator of the present invention uses as a raw material a gas which passes on the permeation side and, therefore, a pressure loss is substantially nil.

The effects of the present invention may be summarized as follows.

(1) The permeable polymer membrane of the present invention can amply desiccate a gas and retain this ability of desiccation intact for a long time.

(2) The desiccation of the gas proceeds without generation of any floating dust.

(3) The membrane is proof against corrosion by an acid gas such as hydrogen chloride gas.

(4) Unlike the molecular sieve used for adsorption, the membrane can be used continuously for a long time without requiring any regeneration.

(5) Various gases such as the gas for the process of producing semiconductor elements, the gas used for the process of producing semiconductor devices, and the gas used for the process of producing new components can be amply desiccated by the membrane of this invention. When the gases so desiccated are used in dry etching, forming oxide coatings, cleaning the surface of semiconductor wafer and the interiors of devices, diffusing impurities on semiconductor wafers or compound semiconductor wafers, and forming coatings on substrates, the semiconductor wafers, the semiconductor devices, the intermediates, and the new components are obtained with improved quality in increased yields.

(6) Since gases are desiccated to a fixed water content, the etched products have their quality and yield unaffected by aging.

(7) Since the removal of water is effected by the membrane, gases desiccated by the membrane of this invention entrain no dust. The products obtained by the use of gases so desiccated enjoy improvement in both yield and quality.

(8) Since the gases being transported have decreased water contents, the pipes used for their transfer are prevented from corrosion and from the generation of fine metallic impurities.

(9) Since the metallic implements such as pipes, valves, and flowmeters which are used in handling gases are prevented from corrosion by extreme desiccation of the gases, the devices and implements enjoy great addition to their service life and the operation utilizing the devices and implements is less expensive.

(10) While water, on decomposition, produces $H_2$ and $O_2$, the desiccation with the membrane of this invention prevents this $O_2$ from giving rise to unexpected oxide impurities.

(11) The desiccation with the membrane of the present invention prevents a gas from undergoing a chemical reaction with water and provides a desired effect. (If the water remaining in a gas settles and persists in a very narrow gap within a reactor, the gas such as, for example, $SiCl_4$ or $SiHCl_3$ which enters the reactor next chemically reacts with the water and, therefore, fails to fulfil its expected function.)

(12) In the case of HCl gas, for example, the desiccation with the membrane of the present invention permits the purity of the HCl gas to be elevated from 3 to 4 times to 4 to 5 times. Thus, inexpensive HCl gas one grade lower can be adopted to permit a notable reduction in the cost of operation.

(13) The desiccation with the membrane of the present invention prevents the protective film on the susceptor (a wafer support) in the CVD device from being corroded by HCl gas and the inside graphite from being exposed.

Now, the present invention will be described more specifically below with reference to working examples. In the working examples and comparative experiments, the water content of gases was measured with a dew-point meter or moisture meter. Some gases were measured by Karl Fischer's method.

Figure 2:
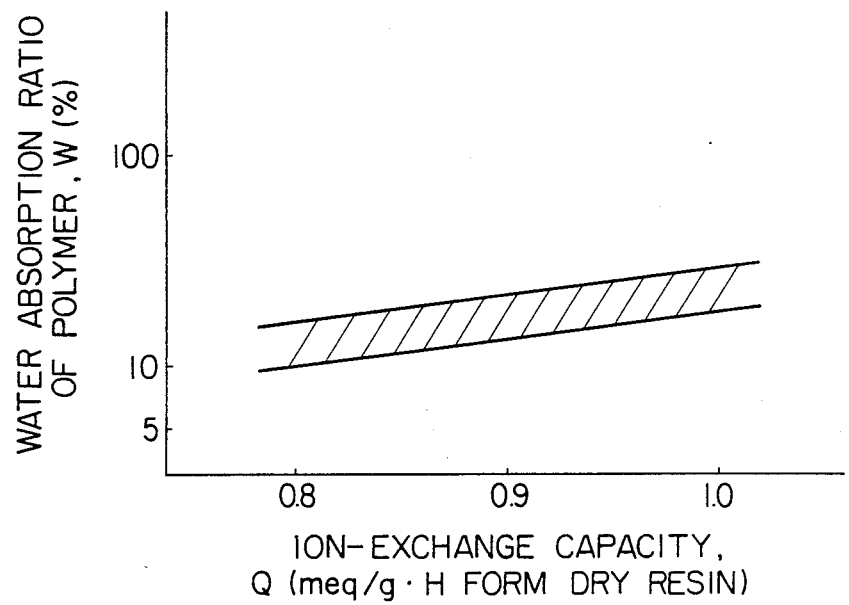
FIG. 2 is a graph showing the relation between the water absorption (W) and the ion-exchange capacity (Q) obtained of a permeable polymer membrane of an ion-exchange capacity of 0.8 to 1.1 produced by a thermal treatment of desiccation at a temperature not less than 70° C. in Example 1.

Similarly, permeable polymer membranes having an ion-exchange capacity of 0.8–1.1 meq./g were prepared using various kinds of monomer as listed in Table A. Their water absorption ratios are also shown in Table A. From the results, the relation between the ion-exchange capacity and the water absorption ratio of the membrane according to the present invention falls in the range indicated by hatch lines in FIG. 2.

TABLE A

| No | Monomer polymerized | Ion-exchange capacity (meq./g of H form dry resin) | Water absorption ratio (%) | Water content of treated gas | Remarks |
|---|---|---|---|---|---|
| 1 | $CF_2=CF_2/CF_2=CFO(CF_2)_3SO_2F$ | 1.02 | 30 | not more than 1 ppm | Membranes of this invention |
| 2 | $CF_2=CF_2/CF_2=CFO(CF_2)_3SO_2F$ | 0.97 | 16 | not more than 1 ppm | |
| 3 | $CF_2=CF_2/CF_2=CFOCF_2\overset{\underset{\mid}{CF_3}}{C}FO(CF_2)_3SO_2F$ | 0.94 | 19 | not more than 1 ppm | |
| 4 | $CF_2=CF_2/CF_2=CFOCF_2\overset{\underset{\mid}{CF_3}}{C}FO(CF_2)_2SO_2F$ | 0.90 | 19 | not more than 1 ppm | |
| 5 | $CF_2=CF_2/CF_2=CFOCF_2\overset{\underset{\mid}{CF_3}}{C}FO(CF_2)_2SO_2F$ | 0.86 | 13 | not more than 1 ppm | |
| 6 | $CF_2=CF_2/CF_2=CFOCF_2\overset{\underset{\mid}{CF_3}}{C}FO(CF_2)_3SO_2F$ | 0.83 | 17 | not more than 1 ppm | |
| 7 | $CF_2=CF_2/CF_2=CFOCF_2\overset{\underset{\mid}{CF_3}}{C}FO(CF_2)_3SO_2F$ | 0.81 | 12 | not more than 1 ppm | |
| 8 | $CF_2=CF_2/CF_2=CFO(CF_2)_3SO_2F$ | 1.05 | 40 | not less than 10 ppm | Membranes not belonging to this invention |
| 9 | $CF_2=CF_2/CF_2=CFOCF_2\overset{\underset{\mid}{CF_3}}{C}FO(CF_2)_3SO_2F$ | 0.94 | 28 | not less than 10 ppm | |
| 10 | $CF_2=CF_2/CF_2=CFOCF_2\overset{\underset{\mid}{CF_3}}{C}FO(CF_2)_2SO_2F$ | 0.82 | 25 | not less than 10 ppm | |

EXAMPLE 1

An H-form dry resin having an ion-exchange capacity of 0.94 meq./g dry resin was obtained by copolymerizing tetrafluoroethylene with

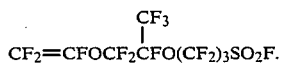

$$CF_2=CFOCF_2\overset{\underset{\mid}{CF_3}}{C}FO(CF_2)_3SO_2F.$$

The resin so produced was molded at 250° C. into the form of a film 500 μm in thickness. This film was hydrolyzed with an alkaline alcohol solution, then subjected to ion exchange with an aqueous hydrochloric acid solution for conversion of the terminal of the side chain to the sulfonate form (H form), and dried in air. The membrane obtained was then dried under a heat vacuum and tested for equilibrium water absorption ratio at 25° C. (FIG. 1). It is noted from FIG. 1 that the water absorption ratio fell down notably at the drying temperature of about 70° C. or higher and remained substantially fixed at higher drying temperatures.

EXAMPLE 2

An H-form dry resin having an ion-exchange capacity of 0.90 meq./g dry resin was obtained by copolymerizing tetrafluoroethylene with

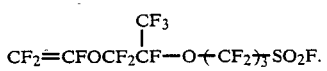

$$CF_2=CFOCF_2\overset{\underset{\mid}{CF_3}}{C}F\!-\!O\!\!+\!\!CF_2\!\!\rightarrow_{\!\!3}SO_2F.$$

With a molding machine provided with a spinneret for the production of hollow fibers, the resin was melt spun at a temperature of 250° C. at a rate of 88 m/m to produce a membrane in the form of hollow fibers having an inside diameter of 500 μm and a wall thickness of 60 μm.

The hollow fibers were hydrolyzed with an alkaline alcohol solution and then subjected to ion exchange with an aqueous hydrochloric acid solution for conversion of the terminal of the side chain to a sulfonate form (H form), and then dried in air. A bundle of 400 hollow fibers 40 cm in unit length was inserted in a separator of SUS, with the opposite ends fixed in position with epoxy resin, to form a water separator as illustrated in FIG. 1. In the separator, $N_2$ gas adjusted to a water content of not more than 1 ppm (a dew point of −76° C.) and compressed to 5 kg/cm²G was passed through the interiors of the hollow fibers at a flow volume of 0.5 liter/min (the flow volume is expressed as reduced to be under atmospheric pressure; the same is applied hereinafter).

N₂ gas adjusted to a water content of not more than 1 ppm (a dew point of −76° C.) was supplied at a flow volume of 0.75 liter/min to sweep the outside of the hollow fibers. The separator was placed in a constant temperature bath at 70° C. and heated therein for 3 hours. Then, the separator was cooled to room temperature. N₂ gas adjusted to a water content of 31 ppm (a dew point of −52° C.) and pressure of 5 kg/cm²G was passed through the interior of the hollow fibers at a flow volume of 0.5 liter/min and N₂ gas adjusted to a dew point of not more than −76° C. (a water content of not more than 1 ppm) was supplied at a flow volume of 0.75 liter/min to sweep the outside of the hollow fibers. The dew point at the N₂ gas outlet of the separator was found to be not more than −76° C. (a water content of not more than 1 ppm). The separator was operated continuously under the existing conditions. After 24 hours' continued operation, the dew point at the N₂ gas outlet was still not more than −76° C. (a water content of not more than 1 ppm).

As regards the purge gas used outside the hollow fibers, the dew point at the outlet of the separator was found to be −66° C. (a water content of 4.6 ppm) when measured after 24 hours' continued operation. After about 1,000 hours' continued operation under the same conditions, the dew point at the N₂ gas outlet was still not more than −76° C. (a water content of 1 ppm). The ratio of the amount of water lost by the sampled gas to the amount of water gained by the purge gas was substantially constant at 1.2:1 within the range of measurement error.

The other membranes of the present invention also exhibited the results similar to those as in Example 2 as shown in Table A.

COMPARATIVE EXPERIMENT 1

In the same apparatus as used in Example 2, the same N₂ gas and purge gas were supplied each without the preheating treatment. After 44 hours' continued operation, the dew point of the N₂ gas failed to reach −60° C. (a water content of 10.6 ppm).

It is also shown in Table A that the membranes which do not belong to this invention exhibit the results similar to those as in Comparative Experiment 1.

EXAMPLE 3

Figure 3:
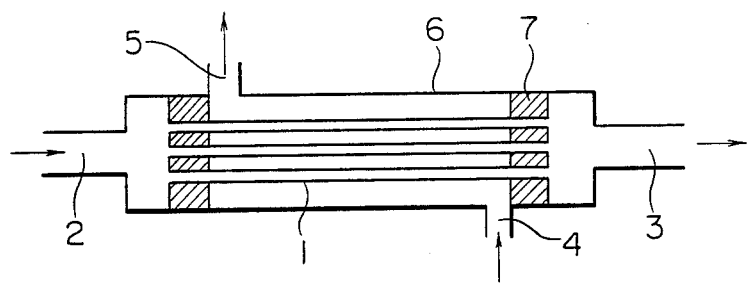
FIG. 3 is a schematic explanatory diagram of water separating means incorporating therein hollow fibers formed of a permeable polymer membrane according to the present invention.

A polytetrafluoroethylene copolymer (an ion-exchange capacity of 0.86 meq./g of H form dry resin) possessing a sulfonate group and containing a repeating unit of the following chemical structure:

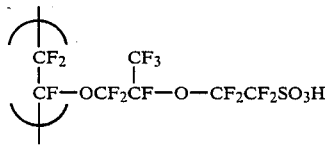

was molded to produce a membrane in the form of hollow-fibers. The hollow fibers measured 500 μm in inside diameter and 620 μm in outside diameter (60 μm in wall thickness). A module was prepared as illustrated in FIG. 3 by bundling 420 hollow fibers having an effective length of about 38 cm. For comparison, hollow-fiber membranes of regenerated cellulose measuring 150 μm in inside diameter and 175 μm in outside diameter (12.5 μm in wall thickness) was prepared by following the procedure of Example 1 of Japanese Patent Application Laid-open Print No. 152,679/1979. A similar module constructed as illustrated in FIG. 3 was produced by bundling these hollow fibers in a total of 420. These hollow fibers had an effective length of about 38 cm. Commercially available molecular sieves were used for comparison.

As a model for the evaluation of yield and quality of etching, five silicon wafers were adopted. After the modules and the molecular sieves had passed HCl gas having a water content of 20 ppm, the silicon wafers were subjected to etching. The outside of the membrane was used as a gas outlet 3 for the module and the purge gas outlet 5 was connected to a vacuum pump. The interior of the module was evacuated to 10⁻² mmHg. On the etched silicon wafers, the numbers of bright points were counted by a mirror test and compared. The bright points are scratches caused by water or fine particles. The results are shown in Table 1. From the data of Table 1, it is noted that the effect of the module of this invention was demonstrated by perfect absence of a bright point.

TABLE 1

|  | Water content of HCl gas (ppm) | Number of bright points (per wafer)* |
|---|---|---|
| No module used (blank) | 20 | 15 |
| Module of this invention used | 0.8 | 0 |
| Molecular sieves used | 0.8 | 7 |
| Module of regenerated cellulose membrane used | 10 | 7 |

*Average of results on five wafers.

A hollow-fiber membrane of a polytetrafluoroethylene copolymer (an ion-exchange capacity of 0.90 meq./g of H form dry resin) containing a repeating unit of the formula:

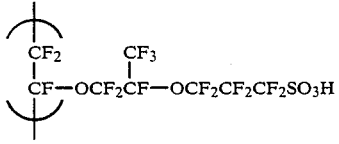

gave substantially the same results as those shown above.

EXAMPLE 4

(1) A polytetrafluoroethylene copolymer (an ion-exchange capacity of 0.94 meq./g of H form dry resin) possessing a sulfonate group and containing a repeating unit of the following chemical structure:

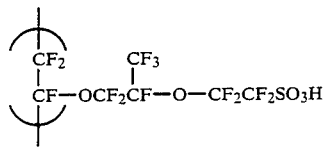

was molded to produce a membrane in the form of hollow fiber (500 μm in inside diameter and 60 μm in wall thickness). The hollow fiber was cut into pieces 40 cm in length. A bundle of 400 cut pieces of hollow fiber was inserted in a casing of SUS, with the opposite ends fixed in position with epoxy resin, to produce a water separator as illustrated in FIG. 3. In the water separator, nitrogen gas adjusted to a water content of not more than 1 ppm and a pressure of 5 kg/cm$^2$G was passed through the interiors of the hollow fibers at a flow volume of 0.5 liter/min. Dry nitrogen gas (purge gas) having a water content of not more than 1 ppm was supplied at a flow volume of 0.75 liter/min under atmospheric pressure to sweep the exteriors of the hollow fibers. The water separator was placed in a constant temperature bath at 70° C. and preheated for 3 hours. It was then cooled to room temperature. The nitrogen gas was switched to hydrogen chloride gas which was adjusted to a water content of 50 ppm and compressed to a pressure of 5 kg/cm$^2$G. This hydrogen chloride gas was passed through the interiors of the hollow fibers at a flow volume of 0.5 liter/min. The water content of the hydrogen chloride gas measured at the outlet of the water separator was found to be 3 ppm. The operation of the separator was continued under the existing conditions. Even after 24 hours' continued operation, the water content of the hydrogen chloride gas was still 3 ppm.

As regards the purge gas fed to sweep the exterior of the hollow fibers, the water content measured at the outlet of the water separator after 24 hours' continued operation was found to be 8 ppm.

After about 1,200 hours of the operation continued under the same conditions, the water content of the hydrogen chloride gas measured at the outlet of the water separator was still 3 ppm.

Figure 4:
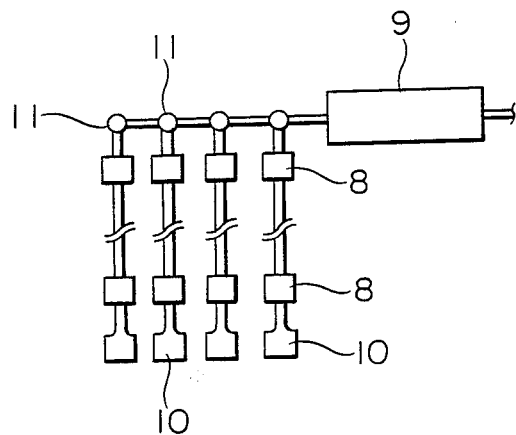
FIG. 4 is a schematic explanatory diagram of a typical apparatus for the formation of a thin-film, constructed by connecting a water separating device to a CVD device or an impurity diffusing device.

Then, with a CVD device and/or impurity diffusing device as illustrated in FIG. 4, the hydrogen chloride gas treated with the water separator and having a water content of 3 ppm was used to form an oxide coating in the production of a semiconductor device. The yield in this production showed an improvement of 4% over that of an operation using hydrogen chloride gas in an undesiccated form.

(2) A hollow-fiber membrane of a polytetrafluoroethylene copolymer (an ion-exchange capacity of 0.90 meq./g of H form dry resin) containing a repeating unit of the following chemical structure:

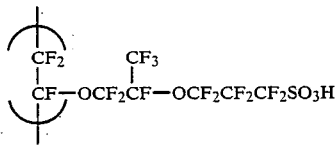

gave substantially the same results as shown above.

EXAMPLES 5-6

With the same water separator as used in Example 4, different raw material gases of different water contents indicated in Table 2 adjusted to the same pressure as in Example 4 were treated and further treated under a varying vacuum condition with the same water separator. The gases resulting from the last treatment were tested for water content. The results are shown in Table 2. With the CVD device and/or impurity diffusing device as illustrated in FIG. 4, a semiconductor wafer, a semiconductor device, and an intermediate were produced by using the gas of the lowered water content. The yield of the production indicated an improvement of 4% over that of a separate production using the gas in an undesiccated form.

TABLE 2

| | Kind and water content of gas | Flow volume of gas (vacuum) | Time of operation | Water content at outlet after desiccation with water separator |
| --- | --- | --- | --- | --- |
| Example 5 | HCl gas 31 ppm | 0.5 l/min. (1.7 × 10$^{-2}$ mm Hg) | 18 hr | 3 ppm |
| Example 6 | H$_2$ gas 6 ppm | 0.5 l/min. (380 mm Hg) | 17 hr | Not more than 1 ppm |

EXAMPLE 7

(1) In the same water separator as prepared in Example 4 (1), nitrogen gas adjusted to a water content of not more than 1 ppm and to a pressure of 5 kg/cm$^2$G was passed at a flow volume of 0.5 liter/min through the interiors of the hollow fibers. Dry nitrogen gas of a water content of not more than 1 ppm (purge gas) under atmospheric pressure was fed at a flow volume of 0.75 liter/min to sweep the exteriors of the hollow fibers. The water separator was placed in a constant temperature bath at 70° C. and heated for 3 hours. Then, it was cooled to room temperature. The nitrogen gas was switched to hydrogen chloride gas which was adjusted to a water content of 31 ppm and compressed to a pressure of 5 kg/cm$^2$G. This hydrogen chloride gas was passed through the interiors of the hollow fibers at a flow volume of 0.5 liter/min. The water content of the hydrogen chloride gas measured at the outlet of the water separator was found to be 3 ppm. The operation was continued under the existing conditions. Even after 24 hours' continued operation, the water content of the hydrogen chloride gas at the outlet was still 3 ppm.

As regards the purge gas used to sweep the exteriors of the hollow fibers, the water content measured at the outlet of the water separator after 24 hours' continued operation was found to be 5 ppm.

After about 1,200 hours' operation continued under the same conditions, the water content of the hydrogen chloride gas measured at the outlet was found to be still 3 ppm.

When H$_2$ gas having a water content of 6 ppm was similarly desiccated with the water separator, there was obtained H$_2$ gas of high purity amply desiccated to a water content of not more than 1 ppm.

(2) In the CVD device as illustrated in FIG. 4, silicon wafers were baked and hot H$_2$ gas (high-purity gas obtained in the above (1)) to remove a natural oxide (SiO$_2$) layer. Then, the silicon wafers were etched with the hydrogen chloride gas of a water content of 3 ppm obtained in the above (1) to effect cleaning of the surface. Subsequently, the CVD device was cleaned by purging with hydrogen chloride gas until complete removal of a halogen component. Then, in the cleaned CVD device, epitaxial growth and diffusion of impurities were performed to produce an intermediate of semiconductor device. The yield of the production of this intermediate indicated an improvement of 4% over that of an operation carried out by using an undesiccated gas.

For cleaning of the interior of an impurity diffusing furnace, the HCl gas amply desiccated with the above specific membrane was passed through the interior of the device to remove the impurities adhering to the inner wall of the quartz tube. After completing the cleaning, diffusion of impurities was performed to produce an intermediate of semiconductor device. The yield of the production indicated an improvement of 2% over that of an operation carried out by using an undesiccated gas.

EXAMPLES 8-9

With the same water separator as prepared in Example 4 (1), raw material gases which were adjusted to one fixed pressure were treated under a vacuum with the water separator by following the procedure of Example 7. The gases so treated were tested for water content. The results are shown in Table 3 below.

TABLE 3

| Example | Kind and water content of gas | Flow volume of gas (vacuum) | Time of operation | Water content at outlet after desiccation with water separator |
|---|---|---|---|---|
| 8 | HCl gas 31 ppm | 0.5 l/min. (1.0 × 10$^{-2}$ mm Hg) | 18 hr | 3 ppm |
| 9 | H$_2$ gas 6 ppm | 0.5 l/min. (380 mm Hg) | 17 hr | Not more than 1 ppm |

The CVD device was cleaned by following the procedure of Example 1, except that silicon wafers were baked with the H$_2$ gas of low water content of Table 1 obtained as described above and then etched and purged with the HCl gas of Table 3. After the cleaning, epitaxial growth and diffusion of impurities were carried out to produce an intermediate of semiconductor device. The yield of this production indicated an improvement of 4% over that of an operation performed with an undesiccated gas.

EXAMPLE 10

In the same water separator as used in Example 4 (1), nitrogen gas adjusted to a water content of not more than 1 ppm and to a pressure of 5 kg/cm$^2$G was passed at a flow volume of 0.5 liter/min through the interiors of the hollow fibers. Dry nitrogen gas (purge gas having a water content of not more than 1 ppm under atmospheric pressure was fed at a flow volume of 0.75 liter/min to sweep the exteriors of the hollow fibers. The water separator was placed in a constant temperature bath at 70° C. and heated therein for 3 hours. It was then cooled to room temperature. The nitrogen gas was switched to phosphine gas which was adjusted to a water content of 30 ppm and compressed to a pressure of 5 kg/cm$^2$G. This phosphine gas was passed through the interiors of the hollow fibers at a flow rate of 0.5 liter/min. The water content of the phosphine gas measured at the outlet of the water separator was found to be not more than 3 ppm. The operation was continued under the existing conditions. After about 800 hours' operation continued under the same conditions, the water content of the phosphine gas at the outlet was found to be still not more than 3 ppm.

EXAMPLES 11, 12, 13

With the same water separator as used in Example 4 (1), varying raw material gases of varying water contents indicated in Table 4 were treated, with the raw material gases and purge gases kept under the same pressure, and were further treated under a vacuum by following the procedure of Example 10. The raw material gases were tested for water content at the outlet of the water separator. The results are shown in Table 4. With a doping device as illustrated in FIG. 4, semiconductor wafers, semiconductor devices, and intermediates thereof were produced by using the gases of low water content described above. The yields indicated an improvement of about 5%.

TABLE 4

| Example | Kind and water content of gas | Flow volume of raw material gas | Purge gas or vacuum | Time of operation | Water content at outlet after desiccation with water separator |
|---|---|---|---|---|---|
| 11 | Phosphine gas 31 ppm | 0.5 lit/min. (Sample gas) | 1.7 × 10$^{-2}$ mm Hg | 19 hr | 3 ppm |
| 12 | Arsine gas 18 ppm | 0.5 lit/min. | 0.75 lit/min. | 22 hr | 1 ppm |
| 13 | Boron trichloride gas 27 ppm | 0.5 lit/min. | 0.75 lit/min. | 18 hr | 3 ppm |

A hollow-fiber membrane obtained by molding a polytetrafluoroethylene copolymer (an ion-exchange capacity of 0.90 meq./g of H form dry resin) containing a repeating unit of the following chemical structure:

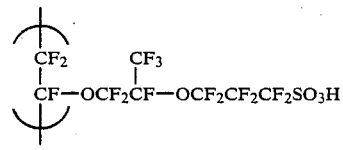

gave substantially the same results as those described above.

EXAMPLES 14, 15, 16

(1) With the same water separator as used in Example 4 (1), varying raw material gases of varying water contents indicated in Table 5 were treated, with the raw material gases and purge gases kept under the same pressure, and were further treated under a vacuum by following the procedure of Example 7. After the treatment, the gases were tested for water content. The results are shown in Table 5. Then, with an epitaxial device as illustrated in FIG. 4, semiconductor wafers, semiconductor devices, and intermediates thereof were produced by using the gases of a low water content described above. The yields indicated an improvement of about 5%.

TABLE 5

| Example | Kind and water content of gas | Flow volume of raw material gas | Purge gas or vacuum | Time of operation | Water content at outlet after desiccation with water separator |
|---|---|---|---|---|---|
| 14 | Hydrogen chloride gas 30 ppm | 0.5 lit/min. (Sample gas) | $1.7 \times 10^{-2}$ mm Hg | 18 hr | 3 ppm |
| 15 | Phosphine gas 31 ppm | 0.5 lit/min. | 0.75 lit/min. | 18 hr | 3 ppm |
| 16 | Arsine gas 18 ppm | 0.5 lit/min. | 0.75 lit/min. | 22 hr | 1 ppm |

(2) A hollow-fiber membrane obtained by molding a polytetrafluoroethylene copolymer (an ion-exchange capacity of 0.90 meq./g H form dry resin) containing a repeating unit of the following chemical structure:

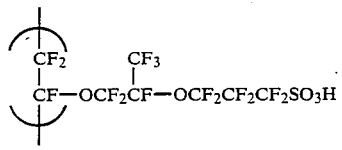

gave substantially the same results as those described above.

EXAMPLE 17

(1) With the same water separator as used in Example 4 (1), nitrogen gas adjusted to a water content of not more than 1 ppm and compressed to a pressure of 5 kg/cm$^2$G was passed at a flow volume of 0.5 liter/min through the interiors of the hollow fibers. Dry nitrogen gas (purge gas) of a water content of not more than 1 ppm was fed at a flow volume of 0.75 liter/min to sweep the exteriors of the hollow fibers. The water separator was placed in a constant temperature bath at 70° C. and heated therein for 3 hours. It was then cooled to room temperature. The nitrogen gas was switched to CH$_4$ gas which was adjusted to a water content of 50 ppm and compressed to 5 kg/cm$^2$G. The CH$_4$ gas was passed through the interiors of the hollow fibers at a flow volume of 0.5 liter/min. The water content of the gas measured at the outlet of the water separator was found to be not more than 1 ppm.

In the same manner as described above, H$_2$ gas was desiccated to a water content of not more than 1 ppm.

With the CVD device as illustrated in FIG. 4, a TiC coating was applied on a punch of steel (SKH 11) by using TiCl$_4$ gas and the CH$_4$ gas and H$_2$ gas desiccated by the water separator as described above.

The TiC coating so formed had a very fine texture consisting of minute crystals. Separately, a TiC coating was formed on the same punch with the same CVD device by using TiCl$_4$ and CH$_4$ (water content of 30 ppm) gas and H$_2$ (23 ppm) gas. Comparison of the two TiC coatings reveals that while the TiC coating produced by using the undesiccated gases offered service life of 50,000 impacts, the TiC coating produced by using the desiccated gases offered service life of 250,000 impacts.

(2) A hollow-fiber membrane obtained by molding a polytetrafluoroethylene copolymer (an ion-exchange capacity of 0.90 meq./g of H form dry resin) containing a repeating unit of the following chemical structure:

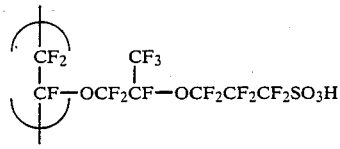

gave substantially the same results.

EXAMPLE 18

A hollow-fiber membrane (500 μm in inside diameter and 60 μm in wall thickness) was produced by molding a polytetrafluoroethylene copolymer (H-form resin having an ion-exchange capacity of 0.90 meq./g of dry resin) possessing a sulfonate group and containing a repeating unit of the following chemical structure:

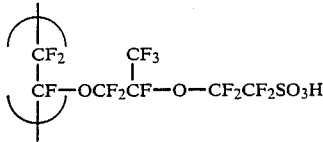

The hollow-fiber was cut into pieces of 40 cm. A bundle of 400 cut pieces was inserted in a casing of SUS, with the opposite ends of the bundle fixed in place with epoxy resin, to produce a water separator illustrated in FIG. 3. In the water separator, nitrogen gas adjusted to a water content of not more than 1 ppm and compressed to a pressure of 5 kg/cm$^2$G was passed through the interiors of the hollow fibers at a flow volume of 0.5 liter/min. Dry nitrogen gas (purge gas) having a water content of not more than 1 ppm under atmospheric pressure was fed at a flow volume of 0.75 liter/min to sweep the exteriors of the hollow fibers. The water separator was placed in a constant temperature bath at 70° C. and heated therein for 3 hours. It was cooled to room temperature. The nitrogen gas was switched to CH$_4$ gas which was adjusted to a water content of 50 ppm and compressed to 5 kg/cm$^2$G. The CH$_4$ gas was passed through the interiors of the hollow fibers at a flow volume of 0.5 liter/min. The water content of the CH$_4$ gas measured at the outlet of the water separator was found to be not more than 1 ppm. In the same manner, Ar gas was desiccated to a water content of not more than 1 ppm.

Figure 5:
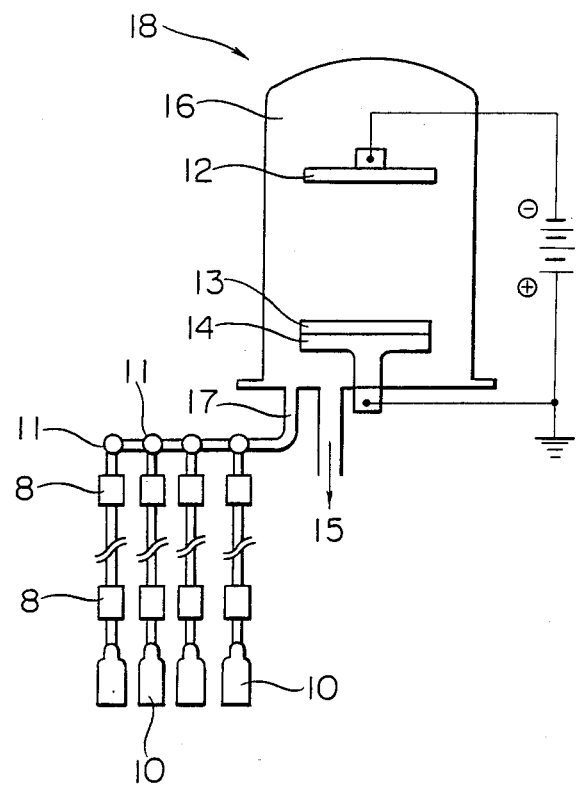
FIG. 5 is a schematic explanatory diagram illustrating a typical apparatus for the formation of a thin-film, constructed by connecting a water separating device to a PVD device.

With a PVD device as illustrated in FIG. 5, a TiC coating was formed on a punch of steel (SKH 11) by using the Ar gas and CH4 gas as obtained above. The coating so formed consisted of extremely small crystals of uniform size and contained no defect of the nature of pinhole. Separately, a TiC coating was formed on the same punch by a spattering treatment using Ar (water content of 20 ppm) gas and CH4 (water content of 30 ppm) gas. Comparison of the two TiC coatings reveals that, while the TiC coating formed by using the undesiccated gases offered service life of 50,000 impacts, the TiC coating formed by using the desiccated gases offered service life of more than 200,000 impacts.

(2) A hollow-fiber membrane obtained by molding a polytetrafluoroethylene copolymer (H-form dry resin having an ion-exchange capacity of 0.94 meq./g of dry resin) containing a repeating unit of the following chemical structure:

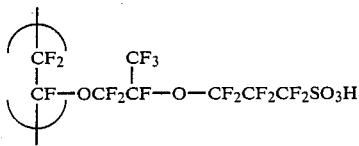

gave substantially the same results as those described above.

EXAMPLE 19

(1) In an atmosphere of argon gas desiccated to a water content of 1 ppm with the same water separator as assembled in Example 18 ($10^{-2}$ Torr), a disc of aluminum-magnesium alloy (AA5086) as a substrate gradually heated to 220° to 260° C. was subjected to a magnetron spattering treatment with a film-forming device using a target of chromium for 1.5 minutes, to produce a substrate provided with an undercoat layer. Again by the magnetron spattering treatment, a magnetic layer of $Co_{80}Ni_{20}$ was formed in a thickness of 0.06 μm on the chromium layer obtained as described above (under the same atmosphere with the same device as used above). A protective layer of carbon was superposed in a thickness of 0.02 μm on the magnetic layer.

The magnetic disc consequently produced was subjected to the CSS test by the conventional method [contact-start-stop test; to be performed by mounting a magnetic disc on a Winchester drive, repeating the operations of start, drive, and stop, and measuring the ratio of output decline (%)]. The results are shown below.

| Number of cycles of CSS | Ratio of output decline (%) |
|---|---|
| 10,000 | 0 |
| 20,000 | 0 |
| 30,000 | 0 |
| 40,000 | 1 |
| 50,000 | 4 |

(2) A hollow-fiber membrane obtained by molding a polytetrafluoroethylene copolymer (an ion-exchange capacity of 0.94 meq./g of H form dry resin) containing a repeating unit of the following chemical structure:

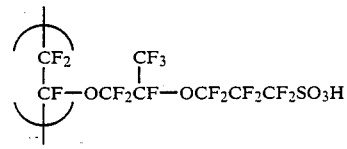

gave substantially the same results as those described above.

COMPARATIVE EXPERIMENT 2

A magnetic disc was produced by following the procedure of Example 19, except that the magnetron spattering treatment was carried out in an atmosphere of Ar gas having a water content of 20 ppm. The magnetic disc was subjected to the same CSS test. The results are shown below.

| Number of cycles of CSS | Ratio of output decline (%) |
|---|---|
| 10,000 | 0 |
| 20,000 | 0 |
| 30,000 | 4 |
| 40,000 | 7 |
| 50,000 | 12 |

EXAMPLE 20

In the same water separator as formed in Example 4 (1), nitrogen gas adjusted to a water content of not more than 1 ppm and compressed to a pressure of 5 kg/cm²G was passed at a flow volume of 0.5 liter/min through the interiors of the hollow fibers. Dry nitrogen gas (purge gas) having a water content of not more than 1 ppm under atmospheric pressure was fed at a flow volume of 0.75 liter/min to sweep the exteriors of the hollow fibers. The water separator was placed in a constant temperature bath at 70° C. and heated therein for 3 hours. It was cooled to room temperature. The nitrogen gas was switched to arsine gas which was adjusted to a water content of 18 ppm and compressed to a pressure of 5 kg/cm²G. The arsine gas was passed through the interiors of the hollow fibers at a flow volume of 0.5 liter/min. The water content of the arsine gas measured at the outlet of the water separator was found to be not more than 1 ppm. The operation was continued under the existing conditions. After 24 hours' operation continued under the same conditions, the water content of the arsine gas was still not more than 1 ppm. The water content of the arsine gas even after about 170 hours' continued operation was still not more than 1 ppm.

EXAMPLES 21-22

With the same water separator as used in Example 20, raw material gases of varying water contents indicated in Table 6 were treated, with the raw material gases and a purge gas kept under the same pressure, and were further treated under a vacuum by following the procedure of Example 20. The water contents of the gases were tested. The results are shown in Table 6. With a reactor (epitaxial reaction device) as illustrated in FIG. 4, compound semiconductor wafers, compound semiconductor devices, and intermediates thereof were produced by using the gas of low water content described above. The yields indicated an improvement of about 3%.

TABLE 6

| Example | Kind and water content of gas | Flow volume of raw material gas | Purge gas or vacuum | Time of operation | Water content at outlet after desiccation with water separator |
|---|---|---|---|---|---|
| 21 | H$_2$ gas 16 ppm | 0.5 lit/min. | 0.75 lit/min. | 19 hr | Not more than 1 ppm |
| 22 | HCl gas 30 ppm | 0.5 lit/min. (Sample gas) | 1.7 × 10$^{-2}$ mm Hg | 18 hr | 3 ppm |

What is claimed is:

1. A method for the desiccation of a water-containing gas, which comprises:
   preparing a permeable polymer membrane formed of a fluorine type copolymer containing a repeating unit represented by the general formula:

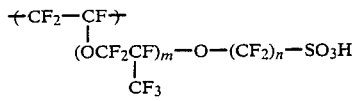

wherein m is 0 or 1 and n is an integer of the value of 2 to 5, said permeable polymer membrane being thermally treated at a temperature in the range of 60° C. to 250° C. and having a water absorption ratio, W, and an ion-exchange capacity, Q, which are represented by the following formula:

$$1.20Q - 1.964 < \log W < 1.20Q - 1.742$$

wherein W is $(W_2-W_1)/W_1$, $W_1$ is a dry weight, $W_2$ is an equilibrium weight as immersed in pure water at 25° C., and Q is an ion-exchange capacity in meq/g of H form dry resin in the form of a membrane; and
   bringing said gas into contact with one side of said membrane, and either bringing a dry purge gas into contact with the other side of said membrane or reducing the pressure on said other side of said membrane thereby removing water from said water-containing gas.

2. The method according to claim 1, wherein said desiccated gas comprises hydrogen chloride.

3. A method for etching a semiconductor wafer, a semiconductor device, or an intermediate thereof, which comprises:
   using a gas which has been desiccated by preparing a permeable polymer membrane formed of a fluorine type copolymer containing a repeating unit represented by the general formula:

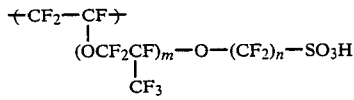

wherein m is 0 or 1 and n is an integer of the value of 2 to 5, said permeable polymer membrane being thermally treated at a temperature in the range of 60° C. to 250° C. and having a water absorption ratio, W, and an ion-exchange capacity, Q, which are represented by the following formula:

$$1.20Q - 1.964 < \log W < 1.20Q - 1.742$$

wherein W is $(W_2-W_1)/W_1$, $W_1$ is a dry weight, $W_2$ is an equilibrium weight as immersed in pure water at 25° C., and Q is an ion-exchange capacity in meq/g of H form dry resin in the form of a membrane; and
   bringing said gas into contact with one side of said membrane, and either bringing a dry purge gas into contact with the other side of said membrane or reducing the pressure on said other side of said membrane thereby removing water from said water-containing gas.

4. The method according to claim 3, wherein said desiccated gas comprises hydrogen chloride.

5. A method of oxide coating in the production of a semiconductor wafer, a semiconductor device, or an intermediate thereof, which comprises:
   forming said oxide coating by the use of an ordinary gas and/or a corrosive gas which has been desiccated by preparing a permeable polymer membrane formed of a fluorine type copolymer containing a repeating unit represented by the general formula:

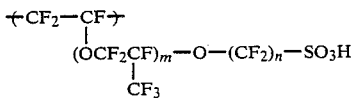

wherein m is 0 or 1 and n is an integer of the value of 2 to 5, said permeable polymer membrane being thermally treated at a temperature in the range of 60° C. to 250° C. and having a water absorption ratio, W, and an ion-exchange capacity, Q, which are represented by the following formula:

$$1.20Q - 1.964 < \log W < 1.20Q - 1.742$$

wherein W is $(W_2-W_1)/W_1$, $W_1$ is a dry weight, $W_2$ is an equilibrium weight as immersed in pure water at 25° C., and Q is an ion-exchange capacity in meq/g of H form dry resin in the form of a membrane; and
   bringing said ordinary and/or corrosive gas into contact with one side of said membrane, and either bringing a dry purge gas into contact with the other side of said membrane or reducing the pressure on said other side of said membrane thereby removing water from said ordinary gas and/or corrosive gas.

6. The method according to claim 5, wherein said desiccated gas comprises hydrogen chloride.

7. A method for cleaning the surface of a semiconductor wafer, a CVD device, and an impurity diffusing furnace in the production of the semiconductor wafer, a semiconductor device, or an intermediate thereof, which comprises:
   passing a raw material gas through an entire system and thereafter effecting said cleaning by the use of a gas which has been desiccated by preparing a permeable polymer membrane formed of a fluorine type copolymer containing a repeating unit represented by the general formula:

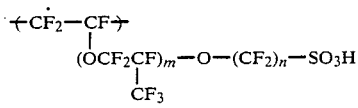

wherein m is 0 or 1 and n is an integer of the value of 2 to 5, said permeable polymer membrane being thermally treated at a temperature in the range of 60° C. to 250° C. and having a water absorption ratio, W, and an ion-exchange capacity, Q, which are represented by the following formula:

$$1.20Q - 1.964 < \log W < 1.20Q - 1.742$$

wherein W is $(W_2 - W_1)/W_1$, $W_1$ is a dry weight, $W_2$ is an equilibrium weight as immersed in pure water at 25° C., and Q is an ion-exchange capacity in meq/g of H form dry resin in the form of a membrane; and bringing said gas into contact with one side of said membrane, and either bringing a dry purge gas into contact with the other side of said membrane or reducing the pressure on said other side of said membrane thereby removing water from said gas.

8. The method according to claim 7, wherein said desiccated gas comprises hydrogen chloride.

9. A method for diffusing impurities in the production of a semiconductor wafer, a compound semiconductor wafer, a semiconductor device, a compound semiconductor device, and/or an intermediate thereof, which comprises:

diffusing said impurities on said semiconductor wafer of said compound semiconductor wafer by the use of a doping gas which has been desiccated by preparing a permeable polymer membrane formed of a fluorine type copolymer containing a repeating unit represented by the general formula:

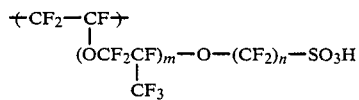

wherein m is 0 or 1 and n is an integer of the value of 2 to 5, said permeable polymer membrane being thermally treated at a temperature in the range of 60° C. to 250° C. and having a water absorption ratio, W, and an ion-exchange capacity, Q, which are represented by the following formula:

$$1.20Q - 1.964 < \log W < 1.20Q - 1.742$$

wherein W is $(W_2 - W_1)/W_1$, $W_1$ is a dry weight, $W_2$ is an equilibrium weight as immersed in pure water at 25° C., and Q is an ion-exchange capacity in meq/g of H form dry resin in the form of a membrane; and bringing said doping gas into contact with one side of said membrane, and either bringing a dry purge gas into contact with the other side of said membrane or reducing the pressure on said other side of said membrane thereby removing water from said doping gas.

10. The method according to claim 9, wherein said desiccated gas comprises hydrogen chloride.

11. A method for forming a coating on a substrate placed under a vacuum or atmospheric pressure, which comprises:

introducing a raw material gas for the formation of said coating and/or a carrier gas into the system enclosing said vacuum or atmospheric pressure therein, wherein said raw material gas and/or carrier gas has been desiccated by preparing a permeable polymer membrane formed of a fluorine type copolymer containing a repeating unit represented by the general formula:

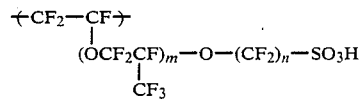

wherein m is 0 or 1 and n is an integer of the value of 2 to 5, said permeable polymer membrane being thermally treated at a temperature in the range of 60° C. to 250° C. and having a water absorption ratio, W, and an ion-exchange capacity, Q, which are represented by the following formula:

$$1.20Q - 1.964 < \log W < 1.20Q - 1.742$$

wherein W is $(W_2 - W_1)/W_1$, $W_1$ is a dry weight, $W_2$ is an equilibrium weight as immersed in pure water at 25° C., and Q is an ion-exchange capacity in meq/g of H form dry resin in the form of a membrane; and bringing said raw material and/or carrier gas into contact with one side of said membrane, and either bringing a dry purge gas into contact with the other side of said membrane or reducing the pressure on said other side of said membrane thereby removing water from said raw material gas and/or carrier gas.

12. A method for producing a permeable polymer membrane having a water absorption ratio, W, and an ion-exchange capacity, Q, represented by the following formula:

$$1.20Q - 1.964 < \log W < 1.20Q - 1.742$$

wherein W is $(W_2 - W_1)/W_1$, $W_1$ is a dry weight, $W_2$ is an equilibrium weight as immersed in pure water at 25° C., and Q is an ion-exchange capacity in meq/g of H form dry resin in the form of a membrane, which comprises:

forming a membrane of a fluorine type copolymer containing a repeating unit represented by the general formula:

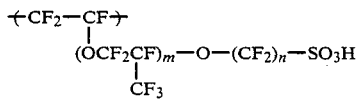

wherein m is 0 or 1 and n is an integer of the value of 2 to 5, and heating the membrane at a temperature in the range of 60° C. to 250° C.

13. The method according to claim 12, wherein said heating is carried out at a temperature in the range of 70° to 200° C.

14. A permeable polymer membrane formed of a fluorine type copolymer containing a repeating unit represented by the general formula:

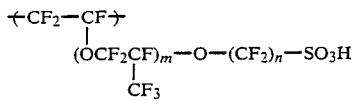

wherein m is 0 or 1 and n is an integer of the value of 2 to 5, said permeable polymer membrane being thermally treated at a temperature in the range of 60° C. to 250° C. and having a water absorption ratio, W, and an ion-exchange capacity, Q, which are represented by the following formula:

$$1.20Q - 1.964 < \log W < 1.20Q - 1.742$$

wherein W is $(W_2 - W_1)/W_1$, $W_1$ is a dry weight, $W_2$ is an equilibrium weight as immersed in pure water at 25° C., and Q is an ion-exchange capacity in meq/g of H form dry resin in the form of a membrane.

15. The permeable polymer membrane according to claim 14, wherein m is 1 and n is 3 in said general formula.

16. The permeable polymer membrane according to claim 14, wherein said permeable polymer membrane is in the form of hollow fibers.

17. The permeable polymer membrane according to claim 14 wherein the ion-exchange capacity is in the range of 0.8-1.8 meq/g of H form dry resin.

18. An apparatus for forming a thin-film, comprising:

a film-forming chamber capable of maintaining the interior thereof under a vacuum or atmospheric pressure, a gas inlet for introducing a gas from a gas supply source into said film-forming chamber, vacuumizing means capable of evacuating said film-forming chamber of a gas, and water separating means interposed between said gas inlet and said gas supply source, wherein said water separating means comprises a casing having inserted therein a multiplicity of hollow fibers of a permeable polymer membrane formed of a fluorine type copolymer containing a repeating unit represented by the general formula:

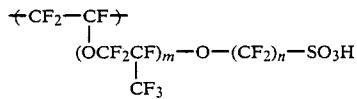

wherein m is 0 or 1 and n is an integer of the value of 2 to 5, said permeable polymer membrane being thermally treated at a temperature in the range of 60° C. to 250° C. and having a water absorption ratio, W, and an ion-exchange capacity, Q, which are represented by the following formula:

$$1.20Q - 1.964 < \log W < 1.20Q - 1.742$$

wherein W is $(W_2 - W_1)/W_1$, $W_1$ is a dry weight, $W_2$ is an equilibrium weight as immersed in pure water at 25° C., and Q is an ion-exchange capacity in meq/g of H form dry resin in the form of a membrane, with the opposite ends of said hollow fibers fixed in place with resin in such a manner that different gases are passable outside and inside said hollow fibers.

* * * * *